United States Patent
Shan

(10) Patent No.: US 10,809,583 B2
(45) Date of Patent: Oct. 20, 2020

(54) ARRAY SUBSTRATE, DISPLAY PANEL AND DISPLAY DEVICE

(71) Applicant: HKC CORPORATION LIMITED, Shenzhen, Guangdong (CN)

(72) Inventor: Jianfeng Shan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 71 days.

(21) Appl. No.: 16/315,558

(22) PCT Filed: Nov. 29, 2018

(86) PCT No.: PCT/CN2018/118057
§ 371 (c)(1),
(2) Date: Jan. 4, 2019

(87) PCT Pub. No.: WO2019/169911
PCT Pub. Date: Sep. 12, 2019

(65) Prior Publication Data
US 2019/0317355 A1    Oct. 17, 2019

(30) Foreign Application Priority Data
Mar. 8, 2018    (CN) .................. 2018 1 0190674

(51) Int. Cl.
*G09G 3/36* (2006.01)
*G02F 1/1362* (2006.01)
*H01L 27/12* (2006.01)

(52) U.S. Cl.
CPC ...... *G02F 1/13624* (2013.01); *H01L 27/1218* (2013.01)

(58) Field of Classification Search
None
See application file for complete search history.

(56) References Cited

U.S. PATENT DOCUMENTS

| | | | |
|---|---|---|---|
| 2006/0158599 A1* | 7/2006 | Koo | G02F 1/13394 349/155 |
| 2007/0035486 A1* | 2/2007 | Kasai | G09G 3/325 345/76 |
| 2011/0169793 A1 | 7/2011 | Chen et al. | |
| 2018/0226039 A1* | 8/2018 | Han | G11C 19/28 |

FOREIGN PATENT DOCUMENTS

| | | |
|---|---|---|
| CN | 106991984 A | 7/2017 |
| CN | 107016973 A | 8/2017 |
| CN | 107134267 A | 9/2017 |
| CN | 107170418 A | 9/2017 |
| CN | 108231033 A | 6/2018 |

OTHER PUBLICATIONS

Yuzhan Yao, the ISA written comments, Mar. 2019, CN.

* cited by examiner

*Primary Examiner* — Carl Adams

(57) ABSTRACT

An array substrate, where the array substrate includes a substrate, an active switch, a shift register circuit disposed at a side edge of the substrate and including multiple stages of shift registers, and each of the shift registers includes a first switch, a second switch, a third switch, a fourth switch, and a fifth switch, in which the distance between a first end and a second end of the plurality of switches of the shift registers is greater than a distance between a first end and a second end of the active switch. Hence, increasing the distance between the first end and the second end of the plurality of switches of the shift registers.

19 Claims, 6 Drawing Sheets

ARRAY SUBSTRATE, DISPLAY PANEL AND DISPLAY DEVICE

CROSS-REFERENCE TO RELATED APPLICATIONS

This application is a U.S. National Stage of International Patent Application No. PCT/CN2018/118057 filed on Nov. 29, 2018, which claims priority to Chinese Patent Application No. 201810190674.0 filed on Mar. 8, 2018, both of which are hereby incorporated by reference as if reproduced in their entireties.

BACKGROUND

Technical Field

The present application relates to the technical field of display, and particularly to an array substrate, a display panel and a display device.

Description of Related Art

The statements herein merely provide background information related to the present application and do not necessarily constitute other approaches. In recent years, with the advancement of technologies, planar liquid crystal displays have become popular. At present, the gate on array (GOA) technology is applied to a liquid crystal display, and in the manufacturing process of the driving circuit of the display panel, the gate driving circuit is directly fabricated on the array substrate, instead of a drive chip fabricated by an externally connected and integrated circuit, which reduces the production process, reduces the cost of the product, and makes the panel thinner.

However, when the GOA technology is applied to a curved display panel, different curvature degrees of the display panel affect the structure and performance of switches in the GOA circuit of the display panel, which further leads to a certain difference in the output of the GOA circuit with a phenomenon of bright and dark lines, thus affecting product quality.

SUMMARY

An object of the present application is to provide an array substrate, which includes, but is not limited to, solving the problem of poor switching electrical property in the GOA circuit of a flexible display panel due to the curvature change, and the problem of bright and dark lines caused by the curvature change.

The technical solutions adopted by the embodiments of the present application are as follows. An array substrate provided by some embodiments of the present application, which includes a substrate, a plurality of active switches disposed at the substrate, and a shift register circuit disposed at the substrate and located at a side edge of the substrate. The shift register circuit has multiple stages of shift registers, and each of the shift registers includes a first switch, where a control end of the first switch is configured to couple to a first node, a first end of the first switch is configured to couple to a frequency signal, and a second end of the first switch is configured to couple to an output pulse signal, a second switch, where a control end and a first end of the second switch are respectively coupled to an input pulse signal, and a second end of the second switch is configured to couple to the first node, a third switch, where a control end of the third switch is configured to couple to a second node, a first end of the third switch is configured to couple to the output pulse signal, and a second end of the third switch is configured to couple to a low preset potential, and a fourth switch, where a control end of the fourth switch is configured to couple to the second node, a first end of the fourth switch is configured to couple to the first node, and a second end of the fourth switch is configured to couple to the low preset potential, where the distance between the first end and the second end of each of the first switch, the second switch, the third switch and the fourth switch is greater than the distance between a first end and a second end of the active switch.

In some embodiments, the shift register circuit includes multiple stages of shift registers, and the multiple stages of shift registers are disposed on a side edge of the substrate in a sequential arrangement.

In some embodiments, the distance between the position of each of the shift registers and the edge of the array substrate is respectively changed in a predetermined manner.

In some embodiments, the distances from the multiple stages of shift registers arranged in sequence on the same side and disposed on the same row of the edge of the array substrate on the same side are decreasing.

In some embodiments, the shift registers disposed on the same side of the array substrate include a first shift register disposed at a first distance from the edge of the array substrate, and a second shift register disposed at a second distance from the edge of the array substrate, in which the first shift register includes a first set of switches, and the distance between a first end and a second end of each of the first set of switches is a third distance, the second shift register includes a second set of switches, and the distance between a first end and a second end of each of the second set of switches is a fourth distance, where the first distance is greater than the second distance, and the third distance is less than the fourth distance.

In some embodiments, the array substrate includes the plurality of active switches and the shift register circuit. The shift register circuit includes multiple stages of shift registers, and the multiple stages of shift registers include a plurality of sets of surface switches. The distance between the first end and the second end of each of the active switches is a standard distance, the distance between a first end and a second end of each of the plurality sets of surface switches is a surface distance, the surface distance is a curve distance from the first end of one surface switch actually to the second end of the surface switch along the surface of the surface switch, the surface distance is greater than the standard distance, and a linear distance between the first end and the second end of one surface switch is equal to the standard distance.

In some embodiments, the distance difference between the linear distance, from the first end to the second end, and the standard distance of one surface switch is within a preset range.

In some embodiments, each of the shift registers includes a plurality of switches, and the curve distance from the first end of each of the switches to the second end of each of the switches is determined according to the actual curvature at different positions of the display panel.

In some embodiments, the shift register circuit includes a compensation circuit, and the compensation circuit includes a fifth switch, where a control end of the fifth switch is configured to couple to the output pulse signal, a first end of the fifth switch is configured to couple to the output pulse signal, and a second end of the fifth switch is configured to couple to the low preset potential.

In some embodiments, the distance between the first end and the second end of the fifth switch is greater than the distance between the first end and the second end of the active switch.

In some embodiments, the first switch, the second switch, the third switch, the fourth switch, and the fifth switch have the same distance between the first end and the second end.

In some embodiments, the first end and the second end of each of the first switch, the second switch, the third switch, the fourth switch, and the fifth switch have the same width.

In some embodiments, the compensation circuit reduces the potential difference between the control end and the first end of the fourth switch.

In some embodiments, each of the shift registers further include a sub pull-down circuit coupled to the first node, the output pulse signal, and the low preset potential.

In some embodiments, each of the shift registers further include a sub pull-down circuit controller coupled to the low preset potential and the sub pull-down circuit.

In some embodiments, the array substrate includes a substrate, a plurality of active switches disposed on the substrate, and a shift register circuit disposed on the substrate and located at a side edge of the substrate. The shift register circuit has multiple stages of shift registers, and each of the shift registers includes a first switch, where a control end of the first switch is configured to couple to a first node, a first end of the first switch is configured to couple to a frequency signal, and a second end of the first switch is configured to couple to an output pulse signal, a second switch, where a control end and a first end of the second switch are respectively coupled to an input pulse signal, and a second end of the second switch is configured to couple to the first node, a third switch, where a control end of the third switch is configured to couple to a second node, a first end of the third switch is configured to couple to the output pulse signal, and a second end of the third switch is configured to couple to a low preset potential, a fourth switch, where a control end of the fourth switch is configured to couple to the second node, a first end of the fourth switch is configured to couple to the first node, and a second end of the fourth switch is configured to couple to the low preset potential, and a fifth switch, where a control end of the fifth switch is configured to couple to the output pulse signal, a first end of the fifth switch is configured to couple to the output pulse signal, and a second end of the fifth switch is configured to couple to the low preset potential, where the first switch, the second switch, the third switch, the fourth switch and the fifth switch have the same distance between the first end and the second end, and the distance between the first end and the second end of the first switch is greater than the distance between a first end and a second end of the active switch, where the first end and the second end of each of the first switch, the second switch, the third switch, the fourth switch, and the fifth switch have an equal projected area on a horizontal plane.

Another object of the present application is to provide a display panel, which includes a first substrate, and an array substrate arranged opposite to the first substrate, where the first substrate and the array substrate are flexible substrates, the array substrate includes a plurality of active switches disposed on the substrate, and a shift register circuit disposed on the substrate and located at a side edge of the substrate, where the shift register circuit has multiple stages of shift registers, and each of the shift registers includes a first switch, a second switch, a third switch and a fourth switch, where the distance between a first end and a second end of each of the first switch, the second switch, the third switch, and the fourth switch is greater than a distance between a first end and a second end of each of the active switches.

Still another object of the present application is to provide a display device, which includes a display panel, and the display panel includes a first substrate, and a second substrate arranged opposite to the first substrate, the array substrate includes a plurality of active switches disposed on the substrate, and a shift register circuit disposed on the substrate and located at a side edge of the substrate, where the shift register circuit has multiple stages of shift registers, and each of the shift registers includes a first switch, a second switch, a third switch, and a fourth switch, where the distance between a first end and a second end of each of the first switch, the second switch, the third switch and the fourth switch is greater than a distance between a first end and a second end of each of the active switches.

Through increasing the distance between the first end and the second end of the plurality of switches of the shift registers, the array substrate, the display panel, and the display device provided by the embodiments of the present application can solve the problem of poor switching electrical property of the flexible display panel due to the curvature change, and the problem of bright and dark lines caused by the curvature change.

BRIEF DESCRIPTION OF DRAWINGS

In order to more clearly illustrate the technical solutions in some of the embodiments of the present application, the drawings used in the description of the embodiments or exemplary technologies will be briefly described below. Obviously, the drawings in the following description are only some embodiments of the present application, and other drawings may be obtained based on these drawings for those of ordinary skill in the art without inventive work.

DESCRIPTION OF EMBODIMENTS

In order to make the purpose, technical solutions and advantages of the present application more clear, the present application will be further described in detail below with reference to the drawings and embodiments. It should be understood that, the specific embodiments described herein are merely for explaining the present application, and not intended to limit the present application.

It should be noted that, when a component is referred to as "being fixed to" or "being arranged to" another component, the component may be directly on another component or indirectly on another component. When a component is referred to as "being connected to" another component, the component may be directly connected to another component or indirectly connected to another component. The orientation or position relationships indicated by the terms such as "on", "below", "left", and "right" and the like are based on the orientation or position relationships shown in the accompanying drawings, and are used only for ease of illustration description, rather than indicating or implying that the mentioned apparatus or component must have a particular orientation or must be constructed or operated in a particular orientation. Therefore, such terms should not be construed as limiting of the present application, and a person of ordinary skill in the art can understand the specific meaning of these terms according to specific situations. The terms "first" and "second" are merely for the purpose of describing, and should not be understood as indicating or implying the relative importance, or suggesting the amounts of the technical features. The phrase "a plurality of" means two or at least two unless otherwise specified.

In order to illustrate the technical solutions described in the present application, the present application will be described in detail with reference to specific drawings and embodiments.

Figure 1A:
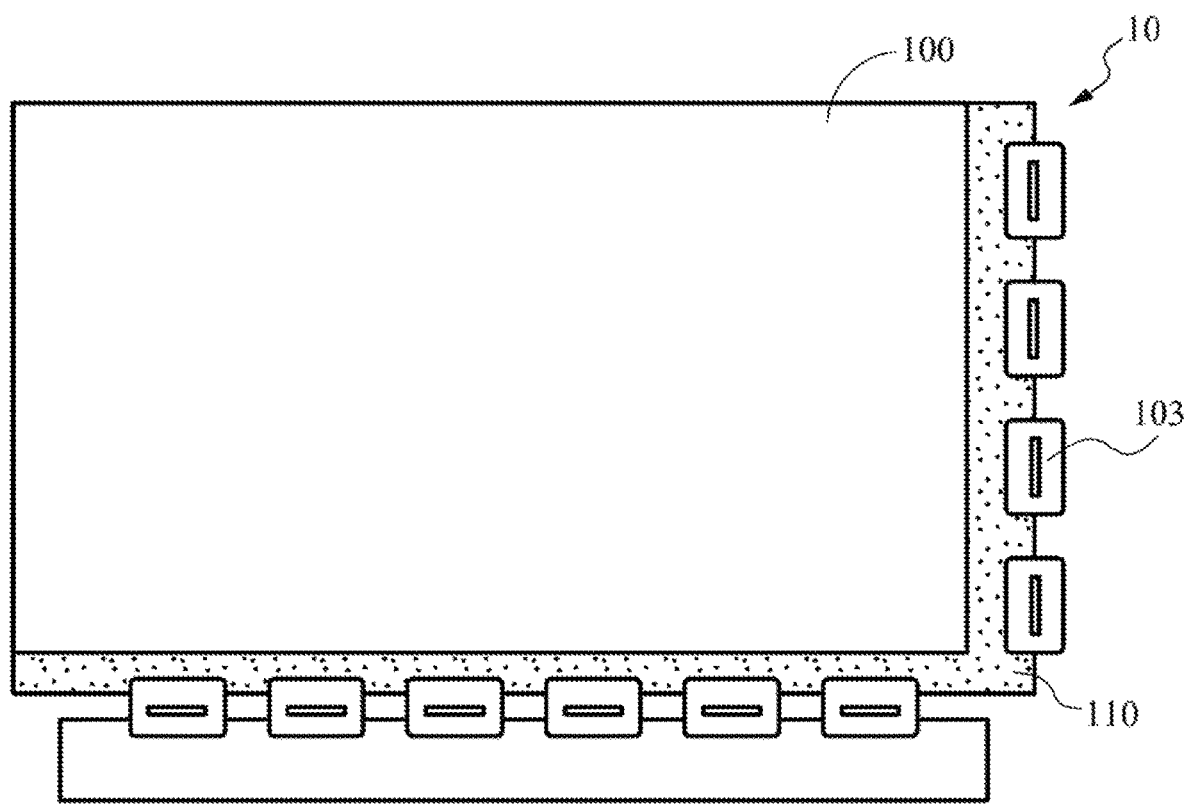
FIG. 1A is a schematic diagram of an exemplary display device.

FIG. 1A is a schematic diagram of an architecture of an exemplary display device. Referring to FIG. 1A, the display device 10 includes a color filter substrate 100, an active array substrate 110, and a driver chip 103 for driving the circuit.

Figure 1B:
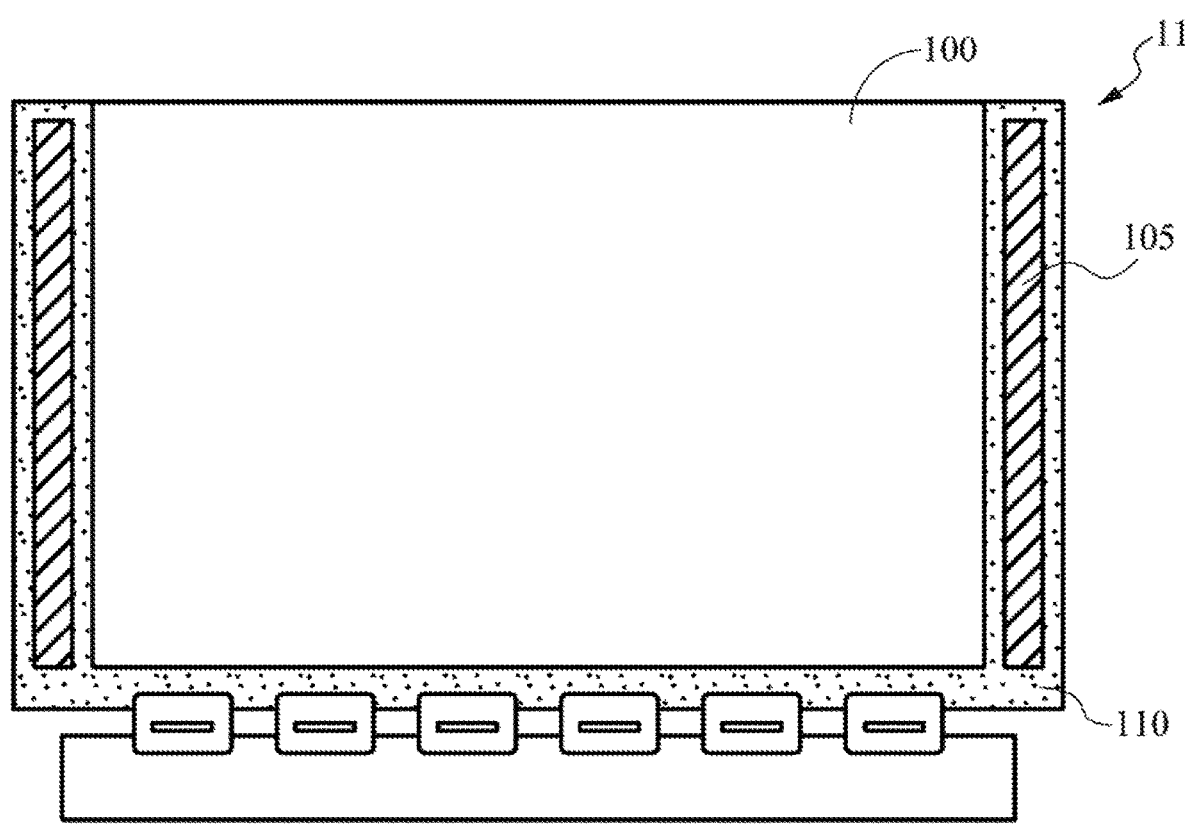
FIG. 1B is a schematic diagram of another exemplary display device.

FIG. 1B is a schematic diagram of another exemplary display device. Referring to FIG. 1B, in an embodiment of the present application, the display device 11 having a gate on array (GOA) includes a color filter substrate 100, an active array substrate 110, and the GOA 105 for fabricating a gate driving circuit on the array substrate 110.

Figure 2A:
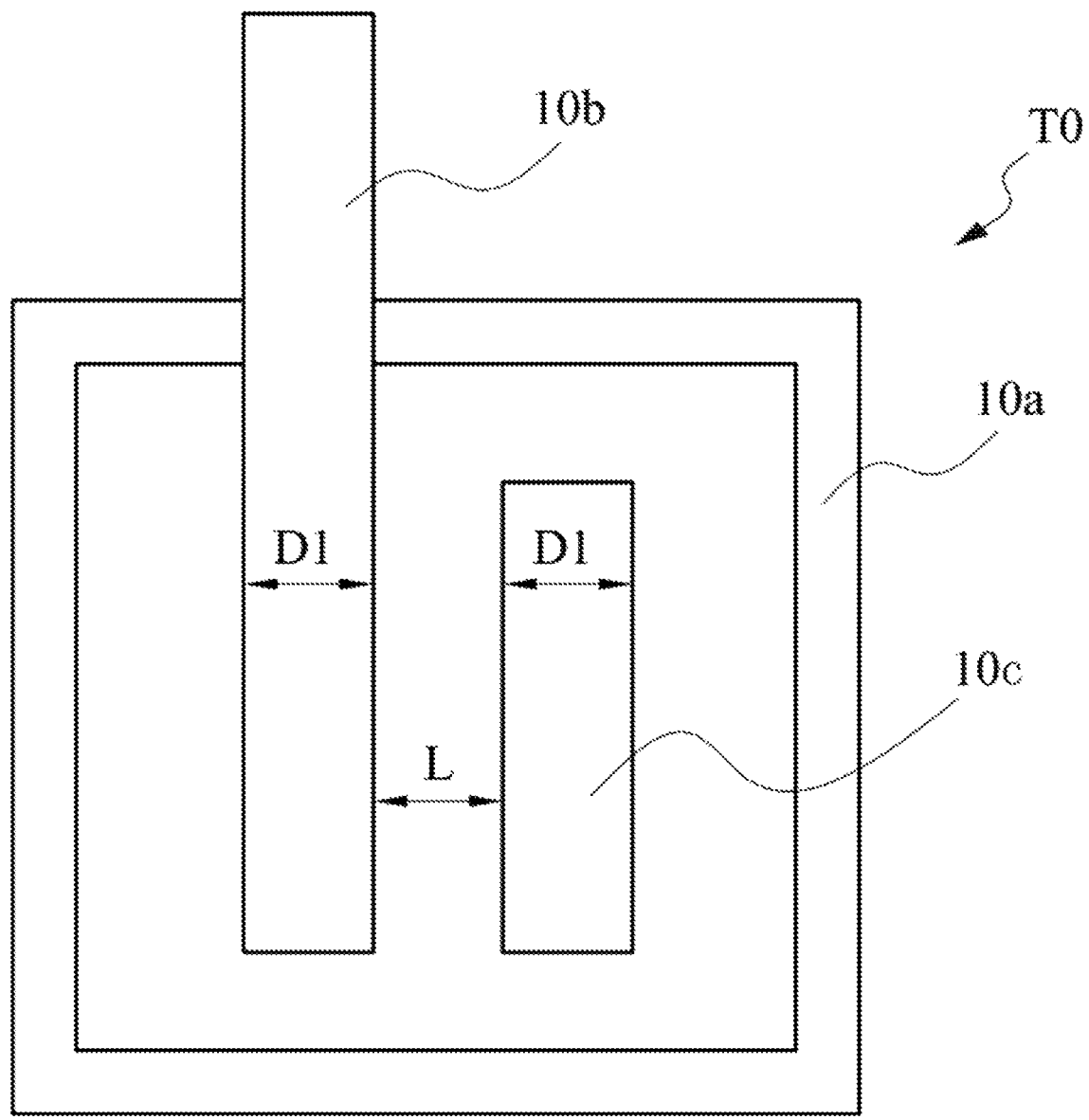
FIG. 2A is a structural schematic diagram of an exemplary active switch.
Figure 2B:
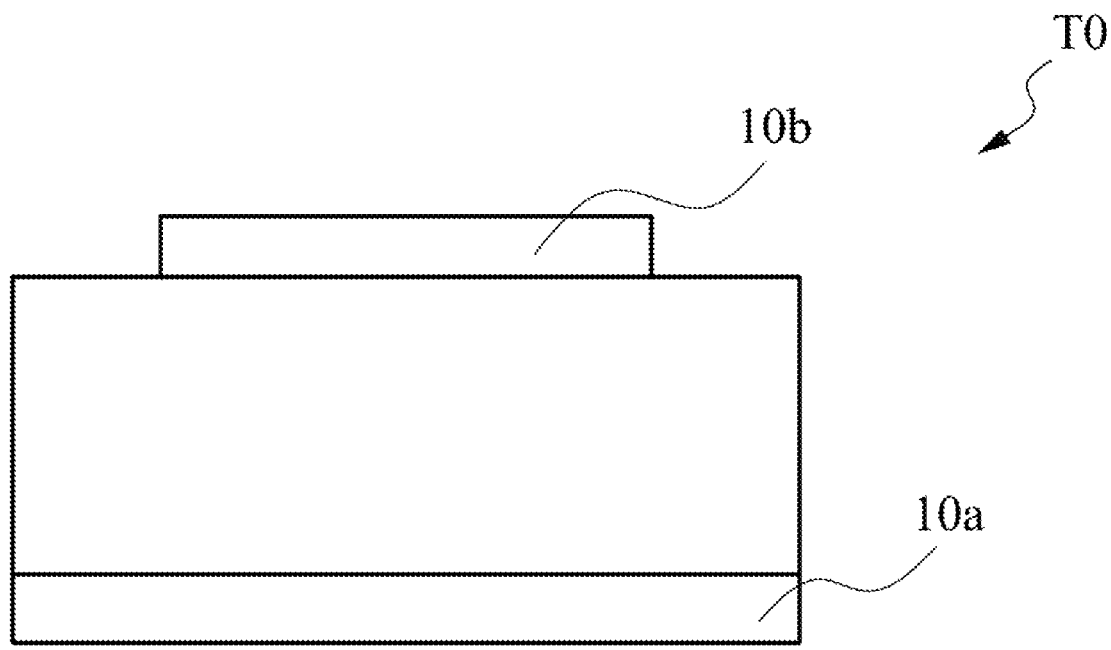
FIG. 2B is a structural schematic diagram of an exemplary active switch.
Figure 2C:
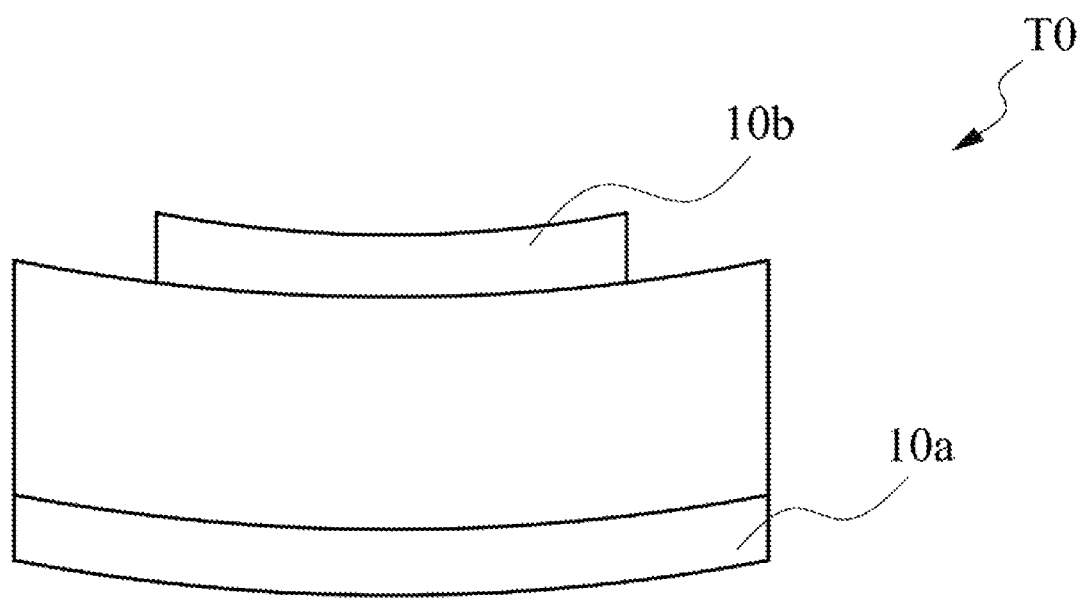
FIG. 2C is a schematic diagram of an exemplary active switch structure and a curved display panel.

FIGS. 2A to 2B are structural schematic diagrams of exemplary active switches, and FIG. 2C is a schematic diagram of an exemplary active switch structure and a curved display panel. Referring to FIG. 1B, FIG. 2A, FIG. 2B and FIG. 2C, when the GOA circuit is applied to a display panel of a curved display device, it is highly likely that the curvature change of the edge of the curved display panel, compared with the planar display device, causes corresponding structure changes of the active switch T0 located here. As shown in FIG. 2A, a control end 10a, a first end 10b, and a second end 10c of the active switch T0 are deformed due to the curvature change of the display panel, and the widths D1 of the first end 10b and the second end 10c of the active switch T0 change due to the curvature change, thereby affecting the structure and performance of the active switch T0. Correspondingly, the electrical properties will also vary to different degrees with the curvature change of the display panel, thereby resulting in output differences and making differences in the charging time of the pixels in the display panel with the phenomenon of bright and dark lines, or color shifts, etc.

Figure 3:
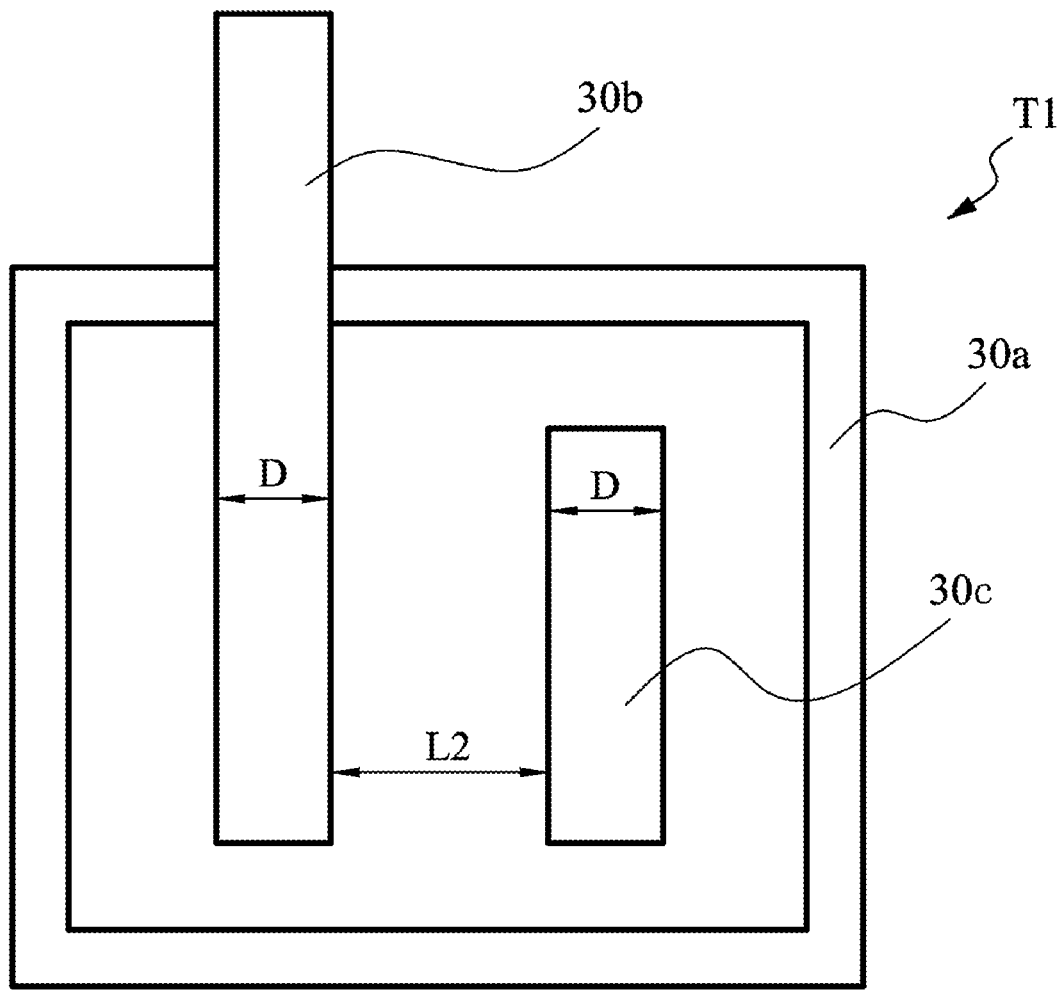
FIG. 3 is a structural schematic diagram of an exemplary active switch in an embodiment of the present application.
Figure 4:
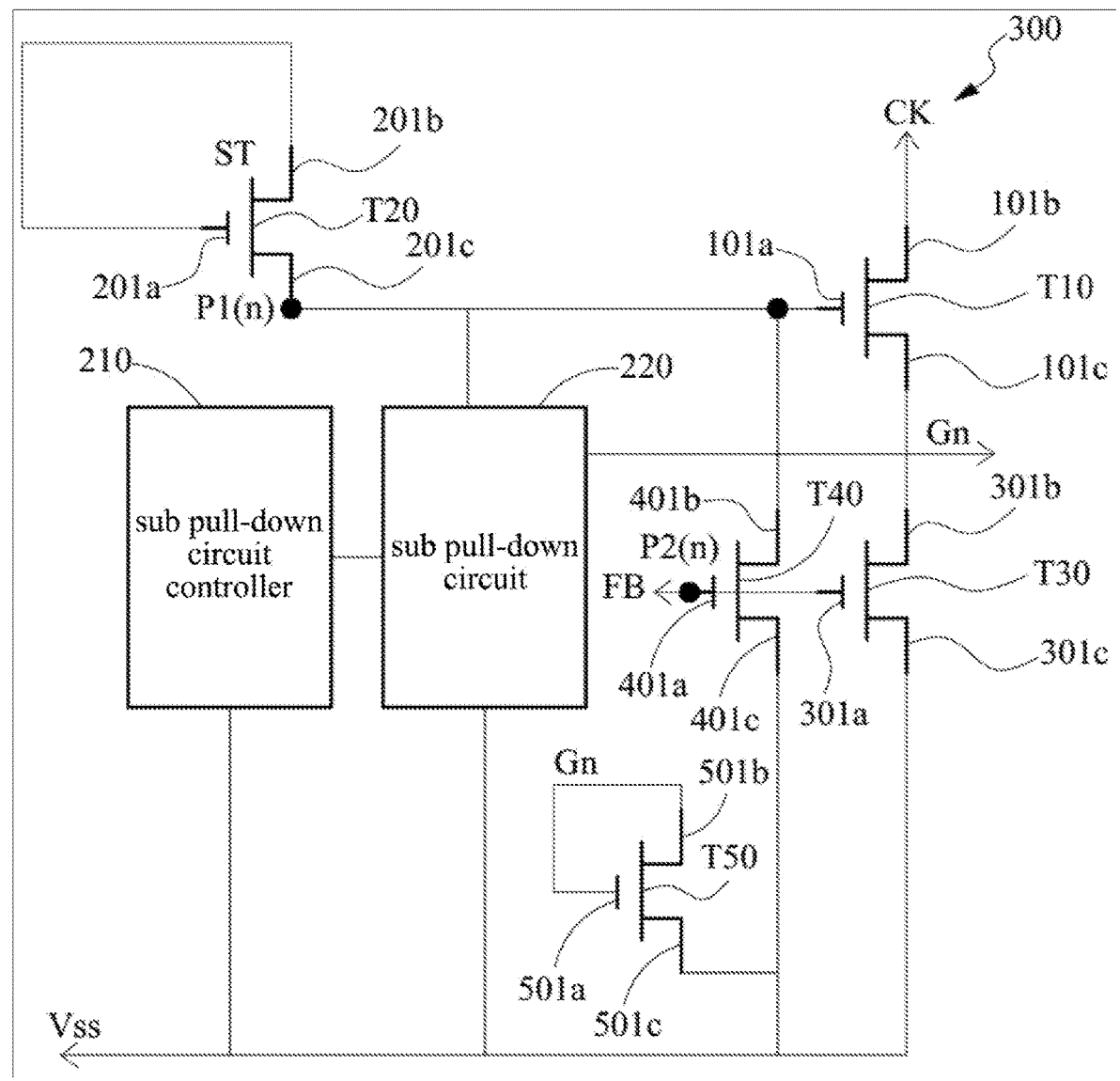
FIG. 4 is a schematic diagram of a pixel circuit in an embodiment of the present application.

FIG. 3 is a structural schematic diagram of an exemplary active switch in an embodiment of the present application, and FIG. 4 is a schematic diagram of an array substrate in an embodiment of the present application. Referring to FIG. 3 and FIG. 4, in some embodiments of the present application, an array substrate includes a substrate (not shown), a plurality of active switches (not shown) disposed on the substrate, and a shift register circuit 300 disposed on the substrate and located at a side edge of the substrate, where the shift register circuit 300 has multiple stages of shift registers, and each of the shift registers includes a first switch T10, where a control end 101a of the first switch T10 is configured to couple to a first node P1($n$), a first end 101b of the first switch T10 is configured to couple to a frequency signal CK, and a second end 101c of the first switch T10 is configured to couple to an output pulse signal Gn, a second switch T20, where a control end 201a of the second switch T20 is configured to couple to an input pulse signal ST, a first end 201b of the second switch T20 is configured to couple to the input pulse signal ST, and a second end 201c of the second switch T20 is configured to couple to the first node P1($n$), a third switch T30, where a control end 301a of the third switch T30 is configured to couple to a second node P2($n$), a first end 301b of the third switch T30 is configured to couple to the output pulse signal Gn, and a second end 301c of the third switch T30 is configured to couple to a low preset potential Vss, a fourth switch T40, where a control end 401a of the fourth switch T40 is configured to couple to the second node P2($n$), a first end 401b of the fourth switch T40 is configured to couple to the first node P1($n$), and a second end 401c of the fourth switch T40 is configured to couple to the low preset potential Vss, where the distances L2 between the first ends and the second ends of the first switch T10, the second switch T20, the third switch T30 and the fourth switch T40 are respectively greater than the distance L between the first end and the second end of the active switch.

In some embodiments, the shift register circuit includes multiple stages of shift registers, and the multiple stages of shift registers are disposed on a side edge of the substrate in a sequential arrangement, the distance between the position of each of the shift registers and the edge of the array substrate is respectively changed in a predetermined manner, and the distances between the multiple stages of shift registers, disposed at the same row and arranged in sequence on the same side, and the edge of the array substrate on the same side are respectively decreasing.

In some embodiments, the shift registers disposed on the same side of the array substrate include a first shift register disposed at a first distance from the edge of the array substrate, and a second shift register disposed at a second distance from the edge of the array substrate, in which the first shift register includes a first set of switches, and the distance between a first end and a second end of each of the first set of switches is a third distance, the second shift register includes a second set of switches, and the distance between a first end and a second end of each of the second set of switches is a fourth distance, where the first distance is greater than the second distance, and the third distance is less than the fourth distance.

In some embodiments, the array substrate includes a plurality of active switches and a shift register circuit, the shift register circuit includes multiple stages of shift registers, and the multiple stages of shift registers include a plurality of sets of surface switches. The distance between a first end and a second end of each of the active switches is a standard distance, the distance between a first end and a second end of each of the plurality sets of surface switches is a surface distance, and the surface distance is an actual curve distance from the first end of one surface switch to the second end of the surface switch along the surface of the surface switch. The surface distance is greater than the standard distance, the linear distance between the first end and the second end of one surface switch is equal to the standard distance, or the distance difference is within a preset range.

In some embodiments, each of the shift registers includes a plurality of switches, and the curve distance from the first end of each of the switches to the second end of each of the switches is determined according to the actual curvature at different positions of the display panel.

In some embodiments of the present application, as shown in FIG. 4, the array substrate further includes a compensation circuit, which includes a fifth switch T50, where a control end 501a of the fifth switch T50 is configured to couple to the output pulse signal Gn, a first end 501b of the fifth switch T50 is configured to couple to the output pulse signal Gn, and a second end 501c of the fifth switch is configured to couple to the low preset potential Vss.

In some embodiments of the present application, the distance L2 between the first end 501b and the second end 501c of the fifth switch T50 is greater than the distance L between the first end and the second end of the active switch.

In some embodiments of the present application, the first switch T10, the second switch T20, the third switch T30, the fourth switch T40, and the fifth switch T50 have a same distance between the first end and the second end.

In some embodiments of the present application, the first switch T10, the second switch T20, the third switch T30, the fourth switch T40 and the fifth switch T50 have a same width between the first end and the second end.

In some embodiments of the present application, the compensation circuit is configured to reduce the potential difference between the control end 401a and the first end 401b of the fourth switch T40.

In some embodiments of the present application, the array substrate further includes a sub pull-down circuit 220 coupled to the first node P1(n), the output pulse signal Gn and the low preset potential Vss.

In some embodiments of the present application, the array substrate further includes a sub pull-down circuit controller 210 coupled to the low preset potential Vss and the sub pull-down circuit.

Referring to FIG. 3 again, with the switch T1 as an example of T10, T20, T30, T40 and T50, the widths of the first end 30b and the second end 30c of the switch T1 are shown as "D", and the distance L2 between the first end 30b and the second end 30c is greater than the distance L between the first end 10b and the second end 10c of the active switch T0 (shown in FIG. 2A). In the curved display panel, through increasing the distance L2 between the first end 30b and the second end 30c of the switch T1, the projected area of the first end 30b and the second end 30c on the control end 30a is configured to be same or close to the distance between the first end 10b and the second end 10c of the active switch T0 (shown in FIG. 2A), so that the switch T1 can maintain good electrical performance, prevent malfunction of the shift register circuit due to poor electrical performance, and prevent problems of bright and dark lines.

Referring to FIG. 3 and FIG. 4 together, in some embodiments of the present application, the display panel includes a first substrate, and an array substrate as described above, and the array substrate is disposed opposite to the first substrate. Therein, the first substrate and the array substrate are flexible substrates.

In some embodiments of the present application, the closer the first switch T10, the second switch T20, the third switch T30, the fourth switch T40, and the fifth switch T50 are to the side edge of the array substrate, the greater the distances L2 between the first ends and the second ends.

In some embodiments of the present application, the first ends and the second ends of the first switch T10, the second switch T20, the third switch T30, the fourth switch T40, and the fifth switch T50 have an equal projected area on a horizontal plane.

In some embodiments, the present application further provides a display panel, which includes a first substrate, and an array substrate arranged opposite to the first substrate, where the first substrate and the array substrate are flexible substrates, the array substrate includes a plurality of active switches disposed on the substrate, and a shift register circuit disposed on the substrate and located at a side edge of the substrate, where the shift register circuit has multiple stages of shift registers, and each of the shift registers includes a first switch, a second switch, a third switch, and a fourth switch, where the distance between a first end and a second end of each of the first switch, the second switch, the third switch, and the fourth switch is greater than a distance between a first end and a second end of each of the active switches.

In some embodiments, the display panel of the present application may be, for example, a liquid crystal display panel, such as a Vertical Alignment (VA) type display panel, which may include a Thin Film Transistor (TFT) substrate, a color film (CF) substrate and a liquid crystal layer formed between the two substrates. In some embodiments, the active array (TFT) and the color filter layer (CF) of the present application may be formed on the same substrate.

In some embodiments, the display panel of the present application is a curved display panel.

In some embodiments, increasing the width D of the first end and the second end of the switch of the shift register circuit 300, such that the shift register circuit 300 on the curved display panel can overcome the electrical defect caused by a sudden change of the curvature of the panel edge, can improve display effects and panel quality.

In some embodiments, the display panel of the present application may also be, for example, a Twisted Nematic (TN) display panel, a Super TN (STN) display panel, an Optically Compensated Birefringence (OCB) display panel, or an Organic Light Emitting Diode (OLED) display panel, or a plasma display panel.

In some embodiments, the present application further provides a display device, which includes a display panel. The display panel includes a first substrate, and an array substrate arranged opposite to the first substrate, the array substrate includes a plurality of active switches disposed on the substrate, and a shift register circuit disposed on the substrate and located at a side edge of the substrate, where the shift register circuit has multiple stages of shift registers, and each of the shift registers includes a first switch, a second switch, a third switch, and a fourth switch, where the distance between a first end and a second end of each of the first switch, the second switch, the third switch and the fourth switch is greater than a distance between a first end and a second end of each of the active switches.

The present application increases the distances between the first ends and the second ends of the switches (T10, T20, T30, T40, T50) of the shift register circuit, and makes the distances be adjusted and designed according to corresponding curvatures of the switches with different curvature ranges of the display panel, such that to solve the problem of poor switching electrical property of the flexible display panel due to the curvature change, and the problem of bright and dark lines caused by the curvature change.

The terms such as "in some embodiments" and "in various embodiments" are used repeatedly. The terms generally do not refer to the same embodiment, however, they may also refer to the same embodiment. The terms such as "containing", "having" and "including" are synonymous, unless the context is intended to mean otherwise.

The above description is merely alternative embodiments of the present application, and is not intended to limit the present application. For those skilled in the art, the present application may have various variations and modifications. Any modification, equivalent substitution, and improvement made within the spirit and principle of the present application, should be included in the scope of claims of the present application.

What is claimed is:

1. An array substrate, comprising:
a substrate;
a plurality of active switches disposed on the substrate; and
a shift register circuit disposed on the substrate and located on a side edge of the substrate, wherein the shift register circuit has a plurality of stages of shift registers, and wherein each of the shift registers comprises:
a first switch, wherein a control end of the first switch is configured to couple to a first node, wherein a first end of the first switch is configured to couple to a frequency signal, and wherein a second end of the first switch is configured to couple to an output pulse signal;
a second switch, wherein a control end and a first end of the second switch are configured to couple to an input pulse signal, and wherein a second end of the second switch is configured to couple to the first node;
a third switch, wherein a control end of the third switch is configured to couple to a second node, wherein a first end of the third switch is configured to couple to the output pulse signal, and wherein a second end of the third switch is configured to couple to a low preset potential; and
a fourth switch, wherein a control end of the fourth switch is configured to couple to the second node, wherein a first end of the fourth switch is configured to couple to the first node, and wherein a second end of the fourth switch is configured to couple to the low preset potential,
wherein a distance between the first end and the second end of each of the first switch, the second switch, the third switch, and the fourth switch is greater than a distance between a first end and a second end of each of the active switch;
wherein the array substrate comprises the plurality of active switches and the shift register circuit, the shift register circuit comprises multiple stages of shift registers, and wherein the multiple stages of the shift registers comprise a plurality of sets of surface switches, wherein a distance between a first end and a second end of each of the active switches is a standard distance, wherein a distance between a first end and a second end of each of the plurality sets of the surface switches is a surface distance, wherein the surface distance is a curve distance from a first end of one surface switch actually to a second end of the one surface switch along a surface of the one surface switch, wherein the surface distance is greater than the standard distance, and wherein a linear distance between the first end and the second end of the one surface switch is equal to the standard distance.

2. The array substrate of claim 1, wherein the shift register circuit comprises multiple stages of shift registers, and the multiple stages of the shift registers are disposed on the side edge of the substrate in a sequential arrangement.

3. The array substrate of claim 1, wherein a distance between a position of each of the shift registers and the side edge of the array substrate is respectively changed in a predetermined manner.

4. The array substrate of claim 3, wherein distances from the multiple stages of the shift registers arranged in sequence on a same side and disposed on a same row to the side edge of the array substrate on the same side are decreasing.

5. The array substrate of claim 1, wherein the shift registers disposed on a same side of the array substrate comprise a first shift register disposed at a first distance from the side edge of the array substrate and a second shift register disposed at a second distance from the side edge of the array substrate, wherein the first shift register comprises a first set of switches, wherein a distance between a first end and a second end of each of the first set of switches is a third distance, wherein the second shift register comprises a second set of switches, wherein a distance between a first end and a second end of each of the second set of switches is a fourth distance, wherein the first distance is greater than the second distance, and wherein the third distance is less than the fourth distance.

6. The array substrate of claim 1, wherein the distance difference between the linear distance, from the first end to the second end, and the standard distance of one surface switch is within a preset range.

7. The array substrate of claim 1, wherein each of the shift registers comprises a plurality of switches, and wherein a curve distance from a first end of each of the switches to a second end of each of the switches is determined according to an actual curvature at different positions of a display panel.

8. The array substrate of claim 1, wherein the shift register circuit comprises a compensation circuit, wherein the compensation circuit comprises a fifth switch, wherein a control end of the fifth switch is configured to couple to the output pulse signal, wherein a first end of the fifth switch is configured to couple to the output pulse signal, and wherein a second end of the fifth switch is configured to couple to the low preset potential.

9. The array substrate of claim 8, wherein a distance between the first end and the second end of the fifth switch is greater than the distance between the first end and the second end of the active switch.

10. The array substrate of claim 9, wherein the distance between the first end and the second end of each of the first switch, the second switch, the third switch, the fourth switch, and the fifth switch have a same distance.

11. The array substrate of claim 9, wherein the first end and the second end of each of the first switch, the second switch, the third switch, the fourth switch, and the fifth switch have a same width.

12. The array substrate of claim 8, wherein the compensation circuit reduces a potential difference between the control end and the first end of the fourth switch.

13. The array substrate of claim 1, wherein each of the shift registers further comprise a sub pull-down circuit coupled to the first node, the output pulse signal, and the low preset potential.

14. The array substrate of claim 13, wherein each of the shift registers further comprise a sub pull-down circuit controller coupled to the low preset potential and the sub pull-down circuit.

15. The array substrate of claim 1, wherein the array substrate comprises: a substrate; a plurality of active switches disposed on the substrate; and a shift register circuit disposed on the substrate and located at a side edge of the substrate, wherein the shift register circuit has multiple stages of shift registers, and each of the shift registers comprise: a first switch, wherein a control end of the first switch is configured to couple to a first node, a first end of the first switch is configured to couple to a frequency signal, and a second end of the first switch is configured to couple to an output pulse signal; a second switch, wherein a control end and a first end of the second switch are respectively configured to couple to an input pulse signal, and a second end of the second switch is configured to couple to the first node; a third switch, wherein a control end of the third switch is configured to couple to a second node, a first end of the third switch is configured to couple to the output pulse signal, and a second end of the third switch is configured to couple to a low preset potential; a fourth switch, wherein a control end of the fourth switch is configured to couple to the second node, a first end of the fourth switch is configured to couple to the first node, and a second end of the fourth switch is configured to couple to the low preset potential; and a fifth switch, wherein a control end of the fifth switch is configured to couple to the output pulse signal, wherein a first end of the fifth switch is configured to couple to the output pulse signal, wherein a second end of the fifth switch is configured to couple to the low preset potential the first switch, the second switch, the third switch, the fourth switch and the fifth switch have the same distance between the first end and the second end, and, wherein the distance between the first end and the second end of the first switch is greater than the distance between a first end and a second end of the active switch, wherein the first end and the second end of each of the first switch, the second switch, the third switch, the fourth switch, and the fifth switch have an equal projected area on a horizontal plane.

16. The array substrate of claim 1, wherein each of the shift registers comprises a plurality of switches, and wherein a curve distance from a first end of each of the switches to a second end of each of the switches is determined according to an actual curvature at different positions of a display panel.

17. The array substrate of claim 1, wherein each of the shift registers comprises a plurality of switches, and wherein a curve distance from a first end of each of the switches to a second end of each of the switches is determined according to an actual curvature at different positions of a display panel.

18. A display panel, comprising:
a first substrate; and
an array substrate arranged opposite to the first substrate, wherein the first substrate and the array substrate are flexible substrates, and wherein the array substrate comprises:
a plurality of active switches disposed on the substrate; and
a shift register circuit disposed on the substrate and located on a side edge of the substrate, wherein the shift register circuit has a plurality of stages of shift registers, wherein each of the shift registers comprises a first switch, a second switch, a third switch, and a fourth switch, and wherein a distance between a first end and a second end of each of the first switch, the second switch, the third switch, and the fourth switch is greater than a distance between a first end and a second end of each of the active switches;
wherein the army substrate comprises the plurality of active switches and the shift register circuit, the shift register circuit comprises multiple stages of shift registers, and wherein the multiple stages of the shift registers comprise a plurality of sets of surface switches, wherein a distance between a first end and a second end of each of the active switches is a standard distance, wherein a distance between a first end and a second end of each of the plurality sets of the surface switches is a surface distance, wherein the surface distance is a curve distance from a first end of one surface switch actually to a second end of the one surface switch along a surface of the one surface switch, wherein the surface distance is greater than the standard distance, and wherein a linear distance between the first end and the second end of the one surface switch is equal to the standard distance.

19. A display device, comprising a display panel, and wherein the display panel comprises:
a first substrate; and
an array substrate arranged opposite to the first substrate, wherein the array substrate comprises:
a plurality of active switches disposed on the substrate; and
a shift register circuit disposed on the substrate and located on a side edge of the substrate, wherein the shift register circuit has a plurality of stages of shift registers, wherein each of the shift registers comprises a first switch, a second switch, a third switch, and a fourth switch, and wherein a distance between a first end and a second end of each of the first switch, the second switch, the third switch, and the fourth switch is greater than a distance between a first end and a second end of each of the active switches;
wherein the array substrate comprises the plurality of active switches and the shift register circuit, the shift register circuit comprises multiple stages of shift registers, and wherein the multiple stages of the shift registers comprise a plurality of sets of surface switches, wherein a distance between a first end and a second end of each of the active switches is a standard distance, wherein a distance between a first end and a second end of each of the plurality sets of the surface switches is a surface distance, wherein the surface distance is a curve distance from a first end of one surface switch actually to a second end of the one surface switch along a surface of the one surface switch, wherein the surface distance is greater than the standard distance, and wherein a linear distance between the first end and the second end of the one surface switch is equal to the standard distance.

\* \* \* \* \*